United States Patent
Kotani

[11] Patent Number: 5,808,397
[45] Date of Patent: Sep. 15, 1998

[54] PIEZOELECTRIC RESONANCE DEVICE

[75] Inventor: Kenichi Kotani, Nagaokakyo, Japan

[73] Assignee: Murata Manufacturing Co., Ltd., Nagaokakyo, Japan

[21] Appl. No.: 195,844

[22] Filed: Feb. 14, 1994

Related U.S. Application Data

[63] Continuation of Ser. No. 998,602, Dec. 30, 1992, abandoned.

[30] Foreign Application Priority Data

Jan. 9, 1992 [JP] Japan ................. 4-000331 U

[51] Int. Cl.$^6$ ..................................... H01L 41/08
[52] U.S. Cl. ........................ 310/320; 310/348; 310/340
[58] Field of Search ...................... 310/318–320, 310/333, 340, 344, 346, 348, 366

[56] References Cited

U.S. PATENT DOCUMENTS

| | | | |
|---|---|---|---|
| 5,091,671 | 2/1992 | Yoshida | 310/320 |
| 5,184,043 | 2/1993 | Yoshinaga | 310/320 |

FOREIGN PATENT DOCUMENTS 1-133816  9/1989  Japan .

*Primary Examiner*—Mark O. Budd
*Attorney, Agent, or Firm*—Burns, Doane, Swecker & Mathis, LLP

[57] ABSTRACT

A piezoelectric resonance device wherein both ends of a piezo-resonator which has oscillation electrodes on both sides of a piezoelectric substrate are soldered to the inside of cup portions of input and output terminals respectively, and a pair of opposed capacity electrodes of a capacitor is soldered to the outside of the cup portions. The capacitor has a width larger than that of the cup portions.

5 Claims, 3 Drawing Sheets

PIEZOELECTRIC RESONANCE DEVICE

This application is a continuation of application Ser. No. 07/998,602, filed Dec. 30, 1992 now abandoned.

BACKGROUND OF THE INVENTION

1. Field of the Invention

The present invention relates to a piezoelectric resonance device, and more particularly to a piezoelectric resonance device to be installed in such as an oscillation circuit and a resonance circuit.

2. Description of Related Art

Conventionally, as a capacitor built-in type piezoelectric resonance device, the one shown in FIG. 5 has been provided. A piezo-resonator 20 which has oscillation electrodes 22a and 22b on front and back sides of a piezoelectric substrate 21 is supported by upper cup portions 26 and 28 of a pair of terminals 25 and 27 with soldering. A dielectric substrate 31 has a common capacity electrode 32a on its front side, and a pair of opposed capacity electrodes 32b and 32c on its back side and these form a capacitor 30. The opposed capacity electrodes 32b and 32c are soldered to the outside of the cup portions 26 and 28 of the terminals 25 and 27. Also, an upper portion of a grounding terminal 29 is soldered to a center portion of the common capacity electrode 23a. The capacitor 30 has two capacities between the electrodes 32a and 32b and between the electrodes 32a and 32c. In the electric circuit, these capacities are inserted between the terminals 25 and 29 and between the terminals 27 and 29.

However, in the above-structured piezoelectric resonance device, when the piezo-resonator 20 and the capacitor 30 are soldered to the cup portions 26 and 28 of the terminals 25 and 27, melted solder may flow out in thickness direction of the capacitor 30 as indicated with arrows in FIG. 5, and this may cause a short-circuit among the input and output terminals 25 and 27 and the grounding terminal 29. Also, in order to enlarge the capacity of the capacitor 30, the capacity electrodes 32a, 32b and 32c have to be enlarged. However, if the capacity electrodes 32b and 32c are enlarged, as shown in FIG. 6, a space $A_2$ between the electrodes 32b and 32c becomes narrower. Accordingly, a short-circuit will be easily caused at this part.

SUMMARY OF THE INVENTION

An object of the present invention is to provide a piezoelectric resonance device which prevents a short-circuit among the input terminal, the output terminal and the grounding terminal and a short-circuit between the opposed capacity electrodes of the capacitor when soldering.

In order to attain the object, a piezoelectric resonance device according to the present invention is a capacitor built-in type piezoelectric resonance device wherein both ends of a piezo-resonator and a capacitor are soldered to cup portions of a pair of input and output terminals, and the capacitor is wider than the cup portions.

In the above-mentioned structure, the capacitor is taller than the cup portions of the terminals, so that the fused solder does not flow over the capacitor when soldering. Therefore, no short-circuit among the input terminal, the output terminal and the grounding terminal which is connected with a common capacity electrode of the capacitor will occur. The widths of the capacitor and the cup portions are relative. If the capacitor is made to be wider than a conventional one, the capacity can be increased by widening the area of the capacity electrodes, and also a short circuit between the opposed capacity electrodes caused by soldering can be prevented by widening the space between the opposed capacity electrodes.

BRIEF DESCRIPTION OF THE DRAWINGS

This and other objects and features of the present invention will become apparent from the following description with reference to the accompanying drawings, in which.

DETAILED DESCRIPTION OF THE PREFERRED EMBODIMENTS

Figure 1:
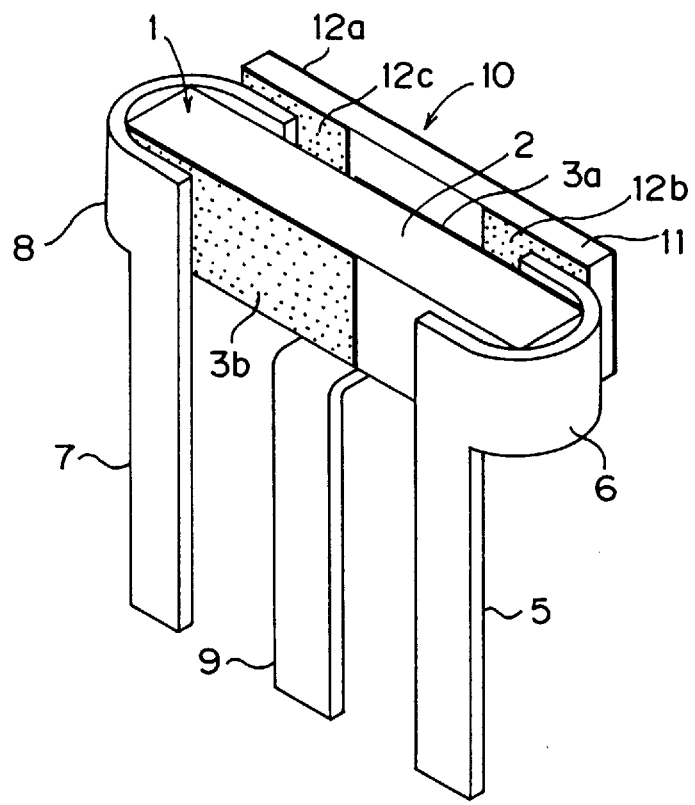
FIG. 1 is a perspective view which shows a piezoelectric resonance device according to the present invention.

The description of a preferred embodiment according to the present invention is given below, referring to the drawings.

Figure 2:
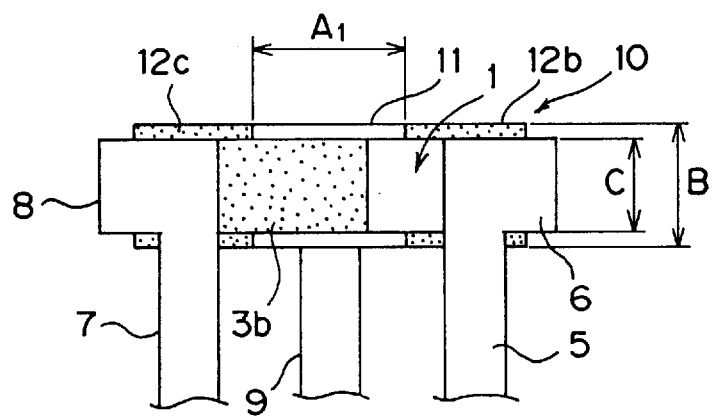
FIG. 2 is a front view of the piezoelectric resonance device.

In FIGS. 1 and 2, a piezo-resonator 1 is composed of a ceramic piezoelectric substrate 2 and oscillation electrodes 3a and 3b which are provided on front and back sides of the piezoelectric substrate 2, and vibrates in a shear mode. A pair of input and output terminals 5 and 7 supports both sides of the piezo-resonator 1 with cup portions 6 and 8 which are formed by bending upper portions of the terminals 5 and 7. Specifically, the cup portions 6 and 8 are soldered to the oscillation electrodes 3a and 3b respectively.

A capacitor 10 is composed of a ceramic dielectric substrate 11, a common capacity electrode 12a which is provided on one side of the substrate 11 and a pair of opposed capacity electrodes 12b and 12c which is provided on the other side. The capacitor 10 has two capacities between the electrodes 12a and 12b and between the electrodes 12a and 12c. The opposed capacity electrodes 12b and 12c of the capacitor 10 are soldered to the outside of the cup portion 6 of the input terminal 5 and the outside of the cup portion 8 of the output terminal 7 respectively. The common capacity electrode 12a is soldered to an upper portion of a grounding terminal 9.

Figure 3:
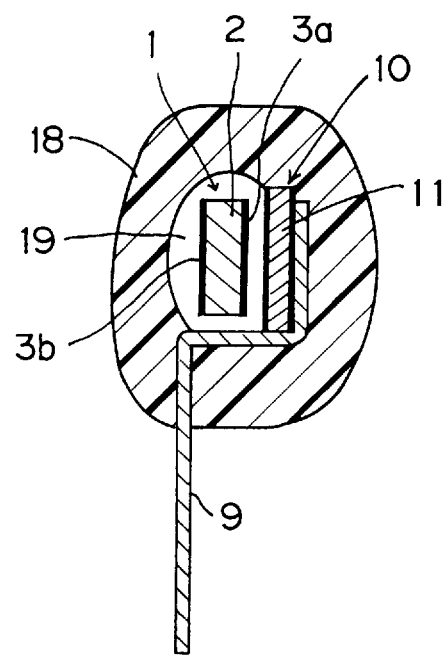
FIG. 3 is a vertical sectional view of the piezoelectric resonance device which is covered with a resin.
Figure 4:
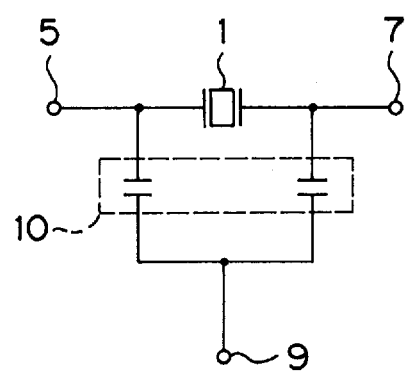
FIG. 4 is an equivalent circuit diagram of the piezoelectric resonance device.
Figure 5:
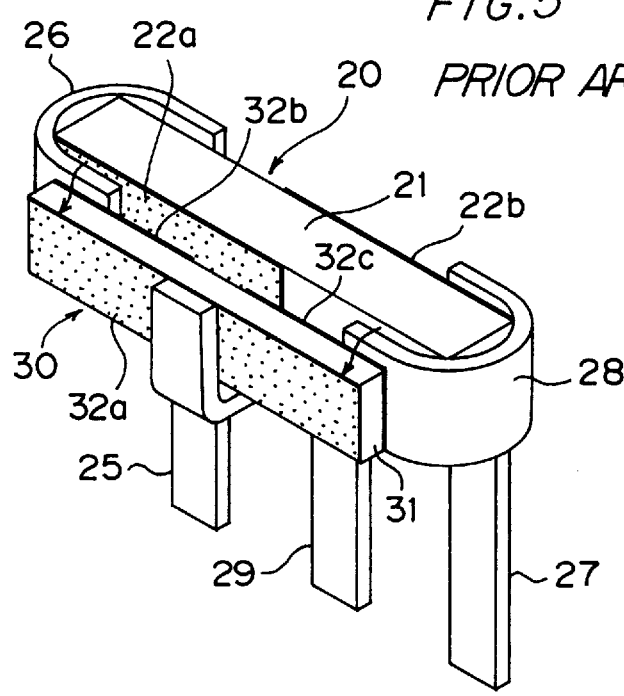
FIG. 5 is a perspective view of a conventional piezoelectric resonance device.
Figure 6:
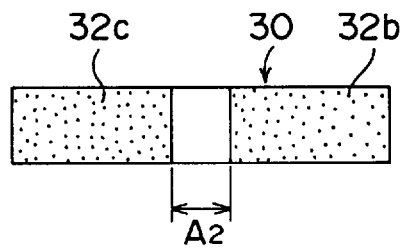
FIG. 6 is a rear view of a capacitor which is installed in a conventional piezoelectric resonance device.

As shown in FIG. 3, these components are covered with a housing 18 to be finished as a piezoelectric resonance device which has an equivalent circuit shown in FIG. 4. The housing 18 is molded out of a resin such that a space 19 for vibration of the piezo-resonator 1 is formed inside and that only the terminals 5, 7 and 9 project from the housing.

In order to solder the cup portions 6 and 8 of the terminals 5 and 7 to the piezo-resonator 1 and the capacitor 10, the cup portions 6 and 8 are coated with solder in advance, and then the solder is melted by hot air. Alternatively, the above three are temporarily held with a jig, and then melted solder is dropped to the cup portions 6 and 8. As shown in FIG. 2, since the capacitor 10 has a width B which is larger than the width C of the cup portions 6 and 8, upper and lower ends of the capacitor 10 project upward and downward from the cup portions 6 and 8. Therefore, when soldering, the melted solder only leans against the opposed capacity electrodes 12b and 12c of the capacitor 10, and does not get over the capacitor 10 in thickness direction. Thereby, a short-circuit among the input and output terminals 5 and 7 and the grounding terminal 9 can be prevented.

The widths B and C are relative. It is possible that the width B of the capacitor 10 is kept a conventional size and the width C of the cup portions 6 and 8 is reduced. Alternatively, conversely, the width B of the capacitor 10 can be widen. In the former way, the conventional capacitor can be used. In the latter way, the areas of the capacity electrodes 12a, 12b and 12c can be widen in order to have a larger capacity. Moreover, the space $A_1$ between the opposed capacity electrodes 12b and 12c can be widen in order to prevent a short-circuit between the electrodes 12b and 12c.

Although the present invention has been described in connection with the preferred embodiment above, it is to be noted that various changes and modifications are possible to a person skilled in the art. Such changes and modifications are to be understood as being within the scope of the present invention.

For example, shapes of the terminals 5, 7 and 9 are optional. Also, the capacity electrodes 12a, 12b and 12c of the capacitor 10 do not have to reach the upper and lower ends of the dielectric substrate 11.

What is claimed is:

1. A piezoelectric resonance device comprising:
    a piezo-resonator which has oscillation electrodes provided on front and back sides of a piezoelectric substrate and vibrates in a shear mode;
    an input terminal and an output terminal for supporting the piezo-resonator, each of the input terminal and the output terminal having cup portions connected with the oscillation electrodes electrically;
    a capacitor which has a common electrode on one side of a dielectric substrate, and opposed electrodes on the other side of the dielectric substrate spaced from one another along a first dimension of the dielectric substrate, the opposed electrodes being connected electrically with an outer side of the cup portions of the terminals along said first dimension and alone a second dimension, the second dimension of the dielectric substrate being larger than that of the cup portions of the terminals; and
    a grounding terminal which is connected electrically with the common electrode of the capacitor.

2. A piezoelectric resonance device as claimed in claim 1, wherein the cup portions of the terminals, the oscillation electrodes of the piezo-resonator and the opposed electrodes of the capacitor are connected electrically through solder which is applied to the cup portions before-hand and then melted with heat.

3. A piezoelectric resonance device as claimed in claim 1, wherein the cup portions of the terminals, the oscillation electrodes of the piezo-resonator and the opposed electrodes of the capacitor are connected electrically through solder which is dropped to the cup portions.

4. A piezoelectric resonance device as claimed in claim 1, further comprising a resin housing for covering the piezo-resonator and the capacitor such that a space for vibration of the piezo-resonator is formed inside.

5. A piezoelectric resonance device comprising:
    a piezo-resonator which has oscillation electrodes provided on front and back sides of a piezoelectric substrate and vibrates in a shear mode;
    an input terminal and an output terminal for supporting the piezo-resonator, each of the input terminal and the output terminal having upper ends formed with cup portions connected with the oscillation electrodes electrically;
    a capacitor which has a common electrode on one side of a dielectric substrate, and opposed electrodes on the other side of the dielectric substrate spaced from one another along a first dimension of the dielectric substrate, the opposed electrodes being connected electrically with an outer side of the cup portions of the terminals along said first dimension and along a second dimension, the second dimension of the dielectric substrate being larger than that of the cup portions of the terminals such that an upward end of said dielectric substrate projects above upward ends of said cup portions; and
    a grounding terminal which is connected electrically with the common electrode of the capacitor.

* * * * *